United States Patent [19]

Arnold et al.

[11] Patent Number: 5,498,291
[45] Date of Patent: Mar. 12, 1996

[54] ARRANGEMENT FOR COATING OR ETCHING SUBSTRATES

[75] Inventors: Manfred Arnold, Mechenkbeuren; Guido Blang, Nauheim; Rainer Gegenwart, Rödermark; Jochen Ritter, Laubach; Helmut Stoll, Sulzbach, all of Germany

[73] Assignee: Leybold Aktiengesellschaft, Hanau, Germany

[21] Appl. No.: 407,783

[22] Filed: Mar. 17, 1995

Related U.S. Application Data

[63] Continuation of Ser. No. 179,398, Jan. 10, 1994, abandoned.

[30] Foreign Application Priority Data

Jan. 19, 1993 [DE] Germany .................. 43 01 188.8

[51] Int. Cl.⁶ .................. C23C 16/00; C23F 1/02
[52] U.S. Cl. .................. 118/723 E; 118/723 ER; 118/723 MP; 118/733 MW; 118/723 ME; 118/729; 156/345
[58] Field of Search .............. 156/345; 118/723 MP, 118/723 MW, 723 ME, 723 MR, 723 MA, 723 E, 723 ER, 729

[56] References Cited

U.S. PATENT DOCUMENTS

| | | | |
|---|---|---|---|
| 3,461,054 | 8/1969 | Vratny | 204/192 |
| 3,617,459 | 11/1971 | Logan | 204/192 |
| 3,767,551 | 10/1973 | Lang, Jr. et al. | 204/192 |
| 4,424,101 | 1/1984 | Nowicki | 204/192 C |
| 4,501,766 | 2/1985 | Suzuki et al. | 118/723 E X |
| 4,572,842 | 2/1986 | Deitrich et al. | 118/719 X |
| 4,633,809 | 1/1987 | Hirose et al. | 118/723 E X |
| 4,676,195 | 6/1987 | Yasui et al. | 118/723 E |
| 4,719,154 | 1/1988 | Hatwar | 428/694 |
| 4,874,494 | 10/1989 | Ohmi | 204/192.12 |
| 4,931,169 | 6/1990 | Scherer et al. | |
| 5,006,192 | 4/1991 | Deguchi | 118/723 E X |
| 5,052,339 | 10/1991 | Vakerlis et al. | 118/723 E |
| 5,113,790 | 5/1992 | Geisler et al. | 118/723 E |
| 5,144,196 | 9/1992 | Gegenwart et al. | 315/111.41 |
| 5,192,370 | 3/1993 | Oda et al. | 118/723 ME |

FOREIGN PATENT DOCUMENTS

| | | |
|---|---|---|
| 0139835 | 5/1985 | European Pat. Off. . |
| 0470580 | 2/1992 | European Pat. Off. . |

(List continued on next page.)

OTHER PUBLICATIONS

P. Vratny: Deposition of Tantalum and Tantalum Oxide by Superimposed RF and DC Sputtering, J. Electrochem. Soc., vol. 114, No. 5, May 1967, p. 506 FIG. 1.

P. Köhler, J. W. Coburn, D. E. Horne, E. Kay: Plasma potentials of 13.56 MHz rf argon glow discharges in a planar system, J. Appl. Phys. 51 (1), Jan. 1985, pp. 59–66.

Butler and Kino: Plasma Sheath Formation by Radio–Frequency Fields, The Physics of Fluids, vol. 6, No. 9, Sep. 1963, pp. 1346–1355.

A. J. van Roosmalen, W. G. M. van den Hoek and H. Kalter: Electrical properties of planar rf discharges for dry etching. J. Appl. Phys. 58, Jul. 1985 pp. 653–658.

J. L. Vossen, Glow Discharge Phenomena in Plasma Etching and Plasma Deposition, J. Electrochem. Soc. SSST, vol. 126, 1979, pp. 319–324.

*Primary Examiner*—R. Bruce Breneman
*Assistant Examiner*—Joni Y. Chang
*Attorney, Agent, or Firm*—Felfe & Lynch

[57] ABSTRACT

The invention relates to an arrangement for coating or etching substrates. In this arrangement an HF substrate bias voltage is generated without contact. For this purpose plasma sources are equipped with a bias pot which is disposed at the dark space distance from a substrate carrier and acted upon by HF. Depending on the source used, the bias pot can be constructed as an independent unit or as a component part of the source connected so as to be conducting-for example as an HF magnetron. Via this coupled-in HF power the dc potential on the carrier, and consequently the ion bombardment on the substrate, can be set specifically.

11 Claims, 2 Drawing Sheets

FOREIGN PATENT DOCUMENTS

| | | |
|---|---|---|
| 2115590 | 10/1972 | Germany . |
| 2241229 | 3/1974 | Germany . |
| 2909804 | 9/1980 | Germany . |
| 3708717 | 9/1988 | Germany . |
| 4039930 | 6/1992 | Germany . |

ARRANGEMENT FOR COATING OR ETCHING SUBSTRATES

This application is a continuation of application Ser. No. 08/179,398, filed Jan. 10, 1994, abandoned.

BACKGROUND OF THE INVENTION

In numerous etching and coating processes plasmas are generated out of which ions are accelerated onto a substrate. In order to be able to control the thickness of a layer or the depth of etching, a dc voltage is provided between two electrodes which enclose a plasma.

If electrically non-conducting layers are to be deposited on a substrate, instead of a dc voltage an ac voltage must be applied in order to build up a dc potential at the substrate which is required for the acceleration of charged particles, in particular of ions, in the direction toward the substrate.

For the coating or etching effect the generation of a stationary potential difference between plasma and electrode is essential, which in the case of an HF voltage applied at the electrode is achieved thereby that during the positive half period significantly more electrons can stream onto the electrode surface than positive ions can escape from it during the negative half period. But since averaged over time an identical quantity of positive and negative charge carriers are carried out of the plasma, the electrode becomes negatively charged relative to the plasma until almost throughout the entire length of the period positive ions can stream in. Before the electrode are generated positive space charge regions leading to a rectifier effect and to the formation of a barrier layer capacitance (cf. DEP 37 08 717, column 5, line 20 to column 6, line 6).

A large number of coating installations with ac current feeds at electrodes are already known which include a plasma volume (U.S. Pat. Nos. 3,461,054, 4,874,494, 4,719,154, 4,424,101, 3,767,551, 3,617,459, 4,572,842; P. Vratny: Deposition of Tantalum and Tantalum Oxide by Superimposed RF and DC Sputtering, J. Electrochem. Soc., Vol. 114, No. 5, May 1967, p. 506, FIG. 1; EP-A-O 347 567; K. Köhler, J. W. Coburn, D. E. Horne, E. Kay: Plasma potentials of 13.56 MHz rf argon glow discharges in a planar system, J. Appl. Phys. 51 (1), January 1985, pp. 59–66; Butler and Kino: Plasma Sheath Formation by Radio-Frequency Fields, The Physics of Fluids, Vol. 6, No. 9, Sept. 1963, pp. 1346–1355; A. J. van Roosmalen, W. G. M. van den Hoek and H. Kalter: Electrical properties of planar rf discharges for dry etching. J. Appl. Phys. 58, July 1985, pp. 653–658; EP 0 470 580. These installations, however, are not suitable for the so-called in-line operation in which several substrates are successively carried past an electrode.

Furthermore is known an arrangement in which substrates to be coated are moved within a receptacle (DE-OS 29 09 804). The high-frequency voltage for the generation of a plasma is herein applied via lines to a substrate holder and to a target holder. Details about the disposition and mounting of the substrate are not shown.

Furthermore is known a plasma reactor in which a first and a second electrode are disposed one opposing the other and wherein a third electrode is provided between the first and the second electrode (EP-A-0 139 835). The first electrode herein is at ground potential while the second electrode is connected to an ac voltage of approximately 100 KHz and the third electrode is supplied with an ac voltage of 13.56 MHz. The electrode disposed between the two other electrodes is herein shaped annularly. However, an in-line operation is also not possible with this plasma reactor because the substrate to be coated is stationarily disposed on the second electrode.

Moreover, an arrangement for etching substrates through a glow discharge is known in which the electrode opposing a substrate carrier is provided in the margin zone with a projection at the same potential, which bridges the volume between the electrode and the substrate or the substrate carrier, with the exception of a gap of approximately 5 mm, in such a way that the glow discharge is limitable to the volume between substrate carrier and electrode (DEP 22 41 229). Because of a closed bell over the substrate carrier and because of the stationary disposition of this substrate carrier this known arrangement is not suitable for an in-line installation. In addition, an HF substrate bias voltage is not settable.

In order to avoid the undesirable effects due to glow discharges, it has been suggested for another known arrangement to minimize the ratio of the area of the electrode supplied with voltage to the area of all other surfaces in contact with the discharge and to use as large a vacuum chamber as possible so that the edges of the electrode are disposed far enough from the chamber walls (J. L. Vossen, Glow Discharge Phenomena in Plasma Etching and Plasma Deposition, J. Electrochem. Soc. SSST, Vol. 126, 1979, pp. 391–324). But any possibility for realizing an in-line installation is also not shown in this arrangement.

In order to be able to apply in the dynamic coating process in in-line systems, in which the substrates are carried by a transport system during the coating past the coating source, the high-frequency voltage to the electrodes it would be conceivable to couple them galvanically via a sliding or roller contact. However, herein parasitic plasmas would occur in the region of the voltage coupling, which could only be suppressed through a technically expensive dark space shield of the transport system. Moreover, the sliding or roller contacts would in time become coated, which would have a negative effect on the power transfer especially if the coating comprises an electric insulator. Added to this is the fact that the strong mechanical strain occurring when using sliding contacts or contact rollers would support the generation of particles which, in turn, would reduce the quality of the layer.

SUMMARY OF THE INVENTION

The invention is based on the task of generating a dc current bias voltage in an HF plasma configuration in which the substrate to be worked is guided past an electrode, which bias voltage is suitable for the acceleration of charged particles toward the substrate.

This task is solved according to the features of patent claim 1.

The advantage achieved with the invention resides in particular therein that for the generation of a bias voltage in in-line operation no galvanic contacting via driving rollers of the substrate carrier is required.

BRIEF DESCRIPTION OF THE DRAWINGS

Embodiment examples of the invention are depicted in the drawing and will be described in further detail in the following. Therein show.

DESCRIPTION OF THE PREFERRED EMBODIMENTS

Figure 1:
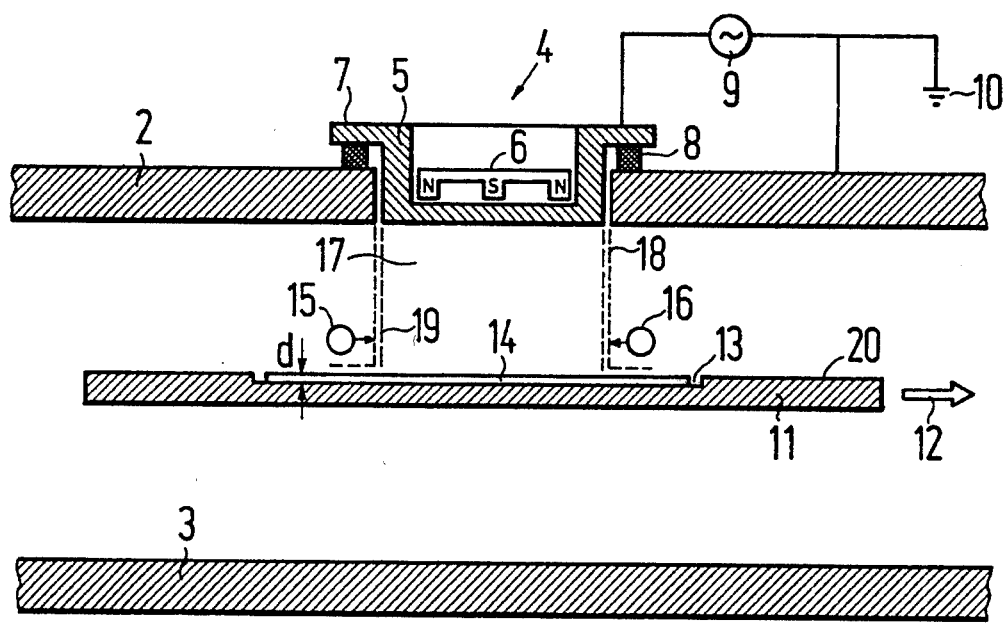
FIG. 1 a plasma chamber in which a substrate is carried past an electrode.

In FIG. 1 is depicted a plasma chamber 1 with an upper and a lower chamber wall 2 or 3 wherein the lower chamber wall 3 is at ground potential. The chamber walls can therein extend very far toward the right and left until they finally are closed off by vertical walls not depicted. Into the upper wall 2 is fitted a magnetron 4 comprising an electrode tub 5 and a triple-pole permanent magnet 6. The electrode tub 5 comprises an upper collar 7 which seats on a seal 8 disposed on the upper wall 2. To the electrode tub 5 is connected the one terminal of an ac voltage source 9, which outputs for example a voltage of 13.56 MHz. The other terminal of the ac voltage source 9 is at ground potential 10 as is also the wall 2.

Between an upper wall 2 and the lower wall 3 is disposed a carrier 11 which can be moved linearly and parallel to walls 2, 3, which is symbolized by an arrow 12. In a depression 13 of this carrier 11 is disposed a substrate 14 to be coated or to be etched.

Between the upper wall 2 and the carrier 11 or the substrate 14 are provided gas inlet pipes 15, 16. These gas inlet pipes 15, 16 are disposed outside of the coating volume 17 in the narrow sense, which is enclosed by a cylindrical grid 18 which also includes a bias pot 19 connected electrically with the electrode 5.

Consequently, the gas supply also takes place in the vacuum chamber, however, it is separated from the plasma volume 17 by a grounded electrode 18. Hereby a coating of the gas inlet pipes 15, 16 is avoided.

The bias pot 19 comprises for example also a grid carried into the proximity of the surface of substrate 14 with the exception of a dark space distance d. Since the surface of the substrate 14 is flush with the surface 20 of carrier 11 outside of the depression 13, the bias pot 19 also maintains a distance d from this surface 20. At a pressure of several $10^{-3}$ mbars the distance d should be in the range of several millimeters. By dark space distance is herein understood the distance which in a glow discharge exists between the cathode and its negative glow light. This so-called cathode dark space is characterized by a strong voltage rise. The grid 18 enclosing the bias pit 19 is connected to ground or chassis. Hereby it is prevented that parasitic plasmas are ignited outside of the plasma volume 17.

If a bias pot 19 without grid 18 were to be provided, a plasma would be ignited from the bias pot 19 to the walls of the vacuum chamber.

The bias pot 19 does not necessarily need to be electrically connected with the electrode 5. Rather, it can be isolated from the electrode. If it is mechanically and electrically connected to the electrode 5 and, together with the electrode 5, is impressed with the voltage of the voltage source 9, plasma parameters and the bias voltage can no longer be set one separately from the other.

The plasma zone 17 is spatially defined by the electrode 5, the bias pot 19 and the substrate 14. In the plasma is generated a positive plasma potential which strongly decreases toward the electrode 5 and the bias pot 19 or to the substrate 14. Thereby the positive ions present in the plasma undergo an acceleration as a function of the potential of the electrode 5. The electrode potentials are a function of the ratio of the electrode areas according to the relationship.

$$\frac{U_{BPT}}{U_{substrate}} = \left(\frac{F_{substrate}}{F_{BPT}}\right)^n$$

where $n = 1\text{--}4$ and $F = $ area

If the bias pot 19 is implemented geometrically so that its area is large in comparison to the effective area of the substrate carrier 11, the greater potential is obtained at the substrate carrier compared with the electrode potential which is negative relative to the plasma potential. Herein only that part of the substrate carrier 11 is included which is directly exposed to the plasma and defined by the opening of the bias pot 19.

In a configuration of this type ions are shot onto the substrate 14 whose energy is defined by the potential difference between substrate carrier 11 and plasma. The absolute potential referred to ground or plasma 10, is therein not of significance because the critical issue is only the potential difference. The substrate carrier 11 can for example also be at ground. In this case the surface of the bias pot 19 which is in that case the greater surface, adjusts to a potential which, relative to chassis, is positive. The plasma potential is more positive so that here also an acceleration of the ions toward the substrate 14 takes place.

The HF substrate bias voltages, and therewith indirectly the energy of the ion bombardment of substrate 14, are consequently adjustable through the geometric implementation of the bias pot 19 and through the power of the high frequency applied to the bias pot 19.

Figure 2:
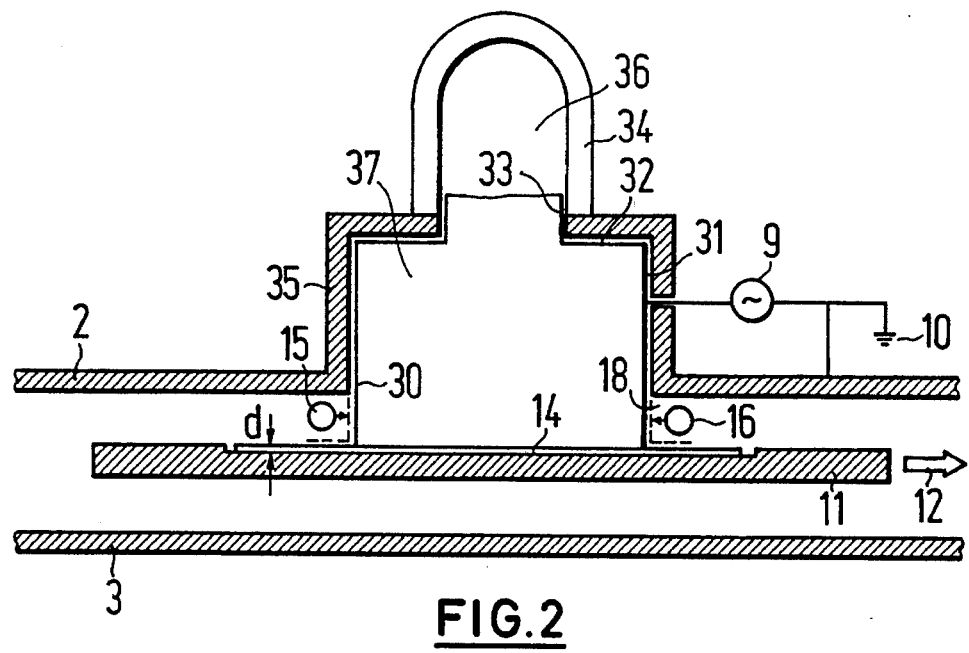
FIG. 2 a further plasma chamber with a movable substrate in which the plasma is excited at a greater distance from the substrate.

In FIG. 2 is depicted a variant of the arrangement shown in FIG. 1, in which those structural parts corresponding to structural parts of the arrangement according to FIG. 1, have the same reference numbers. The bias pot 30 in this arrangement is not implemented as a grid but rather a closed pot which comprises not only a cylindrical outer face 31 but also a bottom 32 with an opening connection piece 33. This opening connection piece 33 projects into a remote cupola-form plasma source 34, whose structure is not depicted in detail. The voltage of the HF voltage source 9 is therein placed directly on the bias pot 30. The grid 18 enclosing the bias pot 30 is herein significantly lower than is the case in the embodiment example of FIG. 1 because a pot-form extrusion 35 of the upper wall 2 extends in the upper direction. The total volume in which a plasma is present and which comprises the two volumes 36 and 37 is greater than the volume 17 in FIG. 1.

Figure 3:
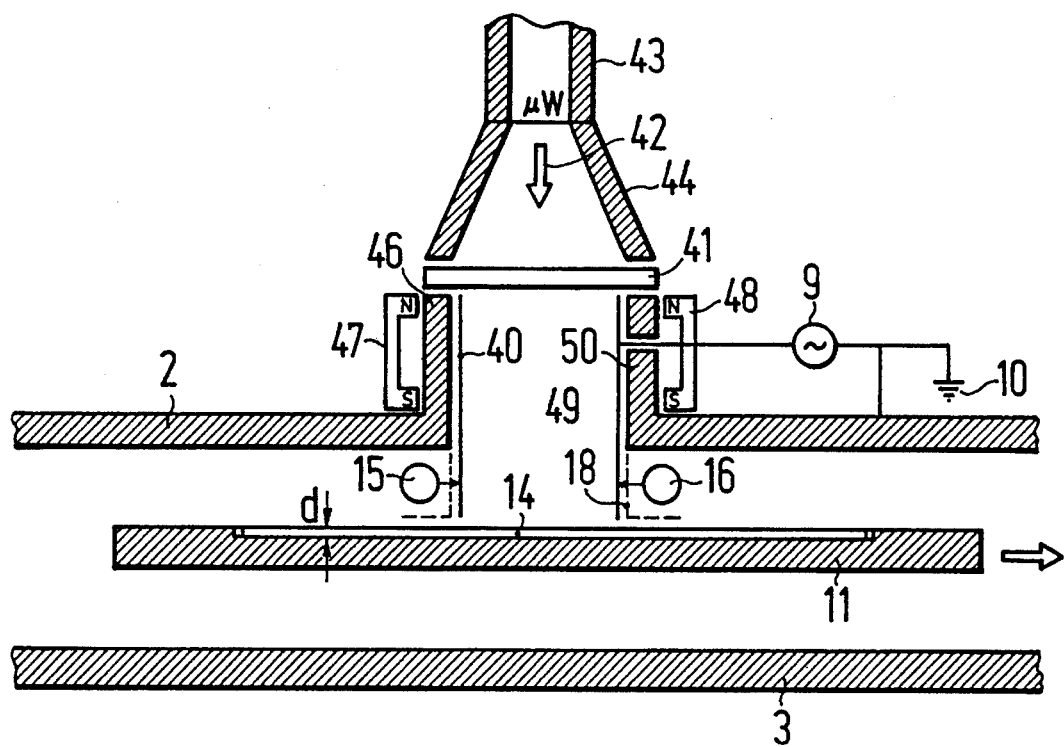
FIG. 3 a further plasma chamber utilizing microwave activation.

FIG. 3 depicts a variant in which a microwave is fed in in order to generate a plasma. The bias pot is herein denoted by 40 and is disposed below a quartz window 41, through which pass microwaves 42 coming from a waveguide 43 and a succeeding horn radiator 44. The upper wall 2 changes over into a hollow connection piece 46 which receives the major portion of the bias pot 40. In that region in which the bias pot is not encompassed by the connection piece 46, the grid 18 is provided. Around the connection piece 46 are disposed permanent magnets 47, 48 which output a cusp-form magnetic field into the volume 49 which is enveloped by the bias pot 40. The high-frequency source 9 is again connected with its one terminal to the bias pot 40 while the other terminal is at chassis or ground 10.

What is claimed is:

1. Arrangement for coating or etching substrates with a process chamber comprising at least one upper limiting wall and one lower limiting wall;

a carrier disposed between the upper and the lower limiting walls;

a substrate disposed on the upper side of the carrier (11);

a plasma-generating arrangement near the upper limiting wall (2) of the process chamber, characterized in that the carrier is displaceable relative to the limiting walls, that between carrier (11) and upper limiting wall at least one gas feed is disposed, that the volume between the plasma-generating arrangement and the immediate proximity over the substrate or the carrier is enclosed by a bias voltage pot, wherein the volume enclosed by the bias voltage pot comprises only plasma, and wherein the distance between the lower edge of the bias voltage pot and the surface of the substrate or the carrier is smaller than the dark space distance, that a voltage source is provided which is electrically connected with the bias voltage pot.

2. Arrangement as stated in claim 1, characterized in that the bias voltage pot is formed by a cylindrical metal grid.

3. Arrangement as stated in claim 1, characterized in that the bias voltage pot comprises a metal cylinder jacket.

4. Arrangement as stated in claim 1, characterized in that a process volume is provided which is closed off by the upper and lower limiting walls.

5. Arrangement as stated in claim 4, characterized in that between the carrier and the upper limiting wall are provided two gas feeds.

6. Arrangement as stated in claim 1, characterized in that the arrangement includes a plasma chamber and the plasma chamber comprises a magnetron in its upper region.

7. Arrangement as stated in claim 1, characterized in that the arrangement includes a plasma chamber and the plasma chamber has a remote plasma source.

8. Arrangement as stated in claim 1, characterized in that the bias voltage pot is connected with a microwave irradiator.

9. Arrangement as stated in claim 7, characterized in that the upper limiting wall of the process chamber comprises an extrusion which encloses the major region of the bias voltage pot.

10. Arrangement as stated in claim 8, characterized in that the upper limiting wall of the process chamber comprises an extrusion which encloses the major region of the bias voltage pot wherein on the outer wall of the extrusion permanent magnets are provided.

11. Arrangement as stated in claim 1, characterized in that the voltage source is an ac voltage source having a frequency of 13.56 MHz.

\* \* \* \* \*